United States Patent
Elzinga

(10) Patent No.: US 6,675,365 B2
(45) Date of Patent: Jan. 6, 2004

(54) METHOD AND SYSTEM FOR PREDICTING WORST-CASE CAPACITIVE AND INDUCTIVE SWITCHING VECTOR

(75) Inventor: Mark Elzinga, Chandler, AR (US)

(73) Assignee: Intel Corporation, Santa Clara, CA (US)

(*) Notice: Subject to any disclaimer, the term of this patent is extended or adjusted under 35 U.S.C. 154(b) by 34 days.

(21) Appl. No.: 10/024,403

(22) Filed: Dec. 14, 2001

(65) Prior Publication Data

US 2003/0115557 A1 Jun. 19, 2003

(51) Int. Cl.⁷ ............................................... G06F 17/50
(52) U.S. Cl. .............................. 716/6; 716/2; 703/16
(58) Field of Search .............................. 716/6, 2; 703/16

(56) References Cited

U.S. PATENT DOCUMENTS

| | | | | |
|---|---|---|---|---|
| 4,041,386 A | * | 8/1977 | Thomas et al. | 324/76.18 |
| 5,535,133 A | * | 7/1996 | Petschauer et al. | 716/19 |
| 5,983,006 A | * | 11/1999 | Carlson et al. | 716/4 |
| 6,029,117 A | * | 2/2000 | Devgan | 702/58 |
| 6,128,769 A | * | 10/2000 | Carlson et al. | 716/6 |
| 6,135,649 A | * | 10/2000 | Feldmann et al. | 703/14 |
| 6,253,359 B1 | * | 6/2001 | Cano et al. | 716/6 |
| 6,330,704 B1 | * | 12/2001 | Ljung et al. | 716/5 |
| 6,353,917 B1 | * | 3/2002 | Muddu et al. | 716/6 |
| 6,363,516 B1 | * | 3/2002 | Cano et al. | 716/5 |
| 6,378,109 B1 | * | 4/2002 | Young et al. | 716/4 |
| 6,389,581 B1 | * | 5/2002 | Muddu et al. | 716/6 |
| 6,405,348 B1 | * | 6/2002 | Fallah-Tehrani et al. | 716/4 |
| 6,449,753 B1 | * | 9/2002 | Aingaran et al. | 716/5 |
| 6,487,703 B1 | * | 11/2002 | McBride et al. | 716/4 |
| 6,493,853 B1 | * | 12/2002 | Savithri et al. | 716/5 |
| 6,498,498 B1 | * | 12/2002 | Menezes et al. | 324/613 |
| 6,499,131 B1 | * | 12/2002 | Savithri et al. | 716/5 |
| 6,507,935 B1 | * | 1/2003 | Aingaran et al. | 716/5 |
| 6,510,540 B1 | * | 1/2003 | Krauter et al. | 716/4 |
| 6,532,574 B1 | * | 3/2003 | Durham et al. | 716/6 |
| 6,536,022 B1 | * | 3/2003 | Aingaran et al. | 716/5 |
| 6,587,815 B1 | * | 7/2003 | Aingaran et al. | 703/13 |
| 6,594,805 B1 | * | 7/2003 | Tetelbaum et al. | 716/5 |
| 2002/0022951 A1 | * | 2/2002 | Heijningen et al. | 703/16 |
| 2002/0166101 A1 | * | 11/2002 | Casavant | 716/6 |

FOREIGN PATENT DOCUMENTS

GB 2341937 A * 3/2000 .......... G01R/31/319

OTHER PUBLICATIONS

Kahng et al., "Noise model for multiple segmented coupled RC interconnects", 2001 Symposium on Quality Electronic Design, Mar. 26, 2001, pp. 145–150.*

Glebov et al., "False–noise analysis using logic implications", IEEE/ACM International Conference on Computer–Aided Design, Nov. 4, 2001, pp. 515–521.*

Sirichotiyakul et al., "Driver modeling and alignment for worst–case delay noise", Proceedings of Design Automation Conference, Jun. 18, 2001, pp. 720–725.*

Gross et al., "Determination of worst–case aggressor alignment for delay calculation", 1998 IEEE/ACM International Conference on Computer–Aided Design, Nov. 8, 1998, pp. 212–219.*

(List continued on next page.)

Primary Examiner—Matthew Smith
Assistant Examiner—Phallaka Kik
(74) Attorney, Agent, or Firm—Kenyon & Kenyon

(57) ABSTRACT

A method and system for determination of the worst case switching vector, which greatly reduces the search space complexity. A single simulation is performed in the time-domain wherein the roles of the victim and attacker conductors are switched. In particular, the search space is reduced by virtue of the fact that certain combinations for the behavior attacker conductors are excluded. Only the phases of the attacker signals need to be determined.

18 Claims, 8 Drawing Sheets

OTHER PUBLICATIONS

Chen et al., "Aggressor Alignment for Worst–Case Crosstalk Noise", IEEE Transactions on Computer–Aided Design of Integrated Circuits and Systems, vol. 20, No. 5, May 2001, pp. 612–621.*

Keller et al., "On reducing the target fault list of crosstalk–induced delay faults in synchronous sequential circuits", Proceedings of International Test Conference, Oct. 30, 2001, pp. 568–577.*

Sasaki et al., "Building a crosstalk library for relative window methods–timing analysis that includes crosstalk delay degradation", Proceedings of the Second IEEE Asia Pacific Conference on ASICS, Aug. 28, 2000, pp. 371–374.*

Bendhia et al., "On chip crosstalk characterization on deep submicron buses", Proceedings of the 2000 Third IEEE International Caracas Conference on Devices, Circuits and Systems, Mar. 15, 2000, pp. C70/1–C70/5.*

Sasaki et al., "Multi–aggressor relative window method for timing analysis including crosstalk delay degradation", Proceedings of the IEEE 2000 Custom Integrated Circuits, May 21, 2000, pp. 495–498.*

Kahng et al., "Noise and delay uncertainty studies for coupled RC interconnects", Proceedings of Twelfth Annual IEEE International ASIC/SOC Conference, Sep. 15, 1999, pp. 3–8.*

Margolese et al., "Using temporal constraints for eliminating crosstalk candidates for design and test", Proceedings of $17^{th}$ IEEE VLSI Test Symposium, Apr. 25, 1999, pp. 80–85.*

Nagarai et al., "A practical approach to crosstalk noise verification of static CMOS designs", Thirteenth International Conference on VLSI Design, Jan. 3, 2000, pp. 370–375.*

Saint–Laurent et al., "A module for interlevel coupling noise in multilevel interconnect structures", Proceedings of the IEEE 2001 International Interconnect Technology Conference, Jun. 4, 2001, pp. 110–112.*

Sylvester et al., "Analytical modeling and characterization of deep–submicrometer interconnect", Proceedings of the IEEE, vol. 89, No. 5, May 2001, pp. 634–664.*

Becer et al., "An analytical model for delay and crosstalk estimation in interconnects under general switching conditions", The $7^{th}$ IEEE International Conference on Electronics, Circuits and Systems, Dec. 17, 2000, vol. 2, pp. 831–834.*

NB9406185, "Statistical Method of Noise Estimation in a Synchronous System", IBM Technical Disclosure Bulletin, vol. 37, No. 6B, Jun. 1994, pp. 185–194 (16 pages).*

* cited by examiner

METHOD AND SYSTEM FOR PREDICTING WORST-CASE CAPACITIVE AND INDUCTIVE SWITCHING VECTOR

FIELD OF THE INVENTION

The present invention relates to the areas of circuit design and simulation. In particular, the present invention provides a method and system for predicting a switching vector producing the worst-case inductive and capacitive noise.

BACKGROUND INFORMATION

Until recently, on-chip inductive signal noise hasn't been considered in microprocessor designs. However, as device sizes continue to shrink, the role of inductive noise becomes more prominent, as the relative area of interconnect to device sizes becomes significant. New tools to analyze inductive noise are currently being developed in the semiconductor and CAD ("Computer Aided Design") industry. Inductive signal noise is difficult to analyze due to the large number of signals that must be considered and the complex three-dimensional nature of the interconnect models that must be generated.

Inductive signal noise usually occurs in interconnects with low resistance, insufficient inductive shielding or over-driven lines. In addition, inductive noise can be of increased concern in wide busses where the signals can switch simultaneously. The inductive coupling can be especially problematic when all of these conditions are present.

As chip speeds continue to increase, neglecting inductive effects may put designs at risk. Just as capacitive coupling must be considered to calculate timing and noise, inductive coupling can be equally important. Mutual inductance impacts noise and timing just as mutual (cross) capacitance impacts noise and timing. In addition, inductive signal noise can potentially violate oxide integrity through repeated noise spikes.

If inductive signal noise is not taken into account, a design may fail. In particular, worst-case noise from capacitive and inductive noise combined can result in false switching. For digital circuits, in particular, it is desirable to determine a worst case switching vector with respect to a node of interest. A switching vector is a set of transition data for each of a set of signals that defines which direction (up or down) attacking signals will switch to obtain the highest magnitude noise pulse at one end (the node where inductive noise is of interest) of the victim line. Typically algorithms for predicting or computing worst-case switching vectors are implemented in software, i.e., running a computer simulation, retrieving data, analyzing the data and then computing the worst-case switching vector.

A key part of inductive noise analysis in on-chip signal grids is determining the true worst-case switching vector. Determining the correct worst-case vector is also important if design decisions (grid changes, driver resizing, etc) will be based on the trends seen in inductive noise. The true trend may be masked if the worst case switching vector changes when the structure itself is changed To determine the worst-case switching vector given an interconnect model that includes inductance and capacitance requires some type of computer simulation. An intensive worst case analysis may be performed that considers all possible switching vectors, but this is too time consuming when considering the total number of possibilities multiplied by the simulation time for one case. In general, the search space to determine the worst case switching vector includes $2^{N-1}$ possibilities, where N is the number of signals under consideration. For instance, if there are 40 signals, then there are $2^{39}$=approx. 550 billion combinations of falling/rising on the attackers. However, it may be possible to perform only N−1 simulations if the system under study involves regular structures. Simulation is computationally expensive especially for busses with many bits because the computation load of simulation versus the number of bits in the bus grows much faster than linearly. In any case, the brute force method for determining the worst-case switching vector should be replaced by an intelligent, knowledge driven process.

In particular, for on-chip interconnects, a large number of signals must be considered for inductive noise analysis—consequently determining the worst-case switching vector is of great importance in the design and development of signal grids. For instance, an on-chip signal bus may be 32, 64, or 128 bits wide and route together for long distances.

Another problem is in determining the worst case in a realistic route where bits in a bus (or a set of signals) can be interleaved along the length or swizzled at the boundary of a metal layer change. To determine the worst-case vector in this scenario would normally require utilizing a brute force trial and error process.

Because inductive noise is becoming more significant as device sizes shrink relative to interconnect, a new approach for accurately predicting worst case switching vector for inductive noise is necessary.

DETAILED DESCRIPTION

According to one known approach, it was assumed that the worst case switching vector occurs when the near attackers and far attackers switch in the opposite direction. This idea is also supported by a review of lossless transmission line theory. The forward-coupled voltage seen at the far end of a victim line may be described as:

$$V_f = \frac{A}{2} \cdot \left( \frac{|C_{12}|}{C_{11}} - \frac{L_{12}}{L_{11}} \right) \cdot \frac{t_d}{t_r} \quad (1)$$

where:
- A is the amplitude of the trapezoidal pulse
- $t_r$ is the rise time
- $t_d$ is the propagation delay across the line
- $C_{12}$ is the mutual capacitance between the victim and the attacker
- $C_{11}$ is the total capacitance on the attacker
- $L_{12}$ is the mutual inductance between the victim and the attacker
- $L_{11}$ is the self (or loop) inductance of the attacker The nearby attackers tend to have a larger capacitive coupling ($C_{12}/C_{11}$) than inductive coupling ($L_{12}/L_{11}$) for on chip signals because the separation is often equal or smaller than the width and thickness of the wire. The far out attackers, on the other hand, have greater inductive coupling ($L_{12}/L_{11}$) since the wires in-between shield the capacitive coupling.

Although this technique provides some insight into inductive effects, it doesn't work in all cases. This is especially true for cases where there are attackers on parallel grids above or below the victim. For example, if the victim line lies in metal 6 ("M6"), a question arises whether any of the metal 4("M4") attackers are capacitive. Also it has been shown that in some grids more than just the nearby attacker is capacitive.

Figure 1:
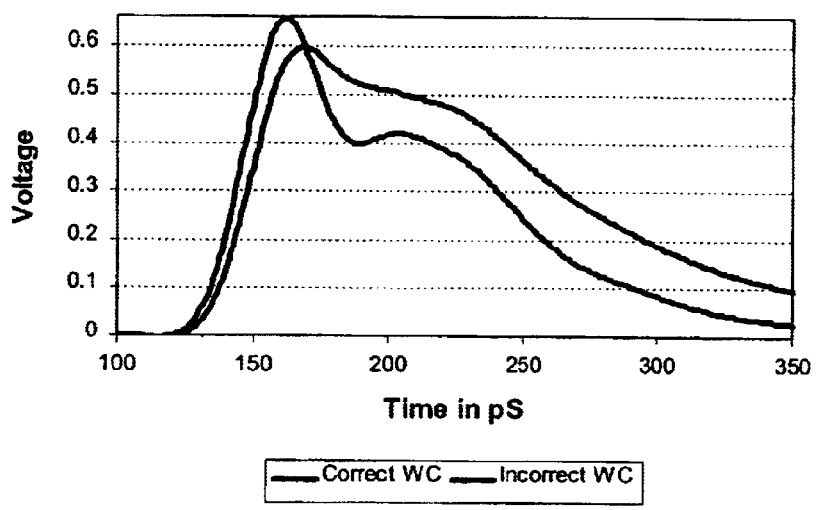
FIG. 1 illustrates the underestimation of inductive noise utilizing the methodology of assuming near attackers rise and far attackers fall.

Another problem with this approach is that far out inductive attackers can actually have an effective negative mutual inductance. Simulation using M6/M4 grids and the above methodology revealed that inductive noise was far underestimated. In particular, the noise peak predicted by allowing the nearby attackers to rise, the far attackers to fall and the victim held low far underestimates the noise. This underestimation is a result of the fact that the far out inductive attackers actually have an effective negative mutual inductive coupling to the victim. FIG. 1 illustrates the underestimation of inductive noise utilizing the methodology of assuming near attackers rise and far attackers fall.

Another possible approach is to apply equation (1) above and determine the worst case switching vector from the RLC matrices. This is not an acceptable approach since resistance is neglected in this equation. On-chip interconnect lines are typically very lossy and therefore the above equation cannot be applied directly.

The present invention provides a method and system for determination of a worst case switching vector with respect to inductive noise, which greatly reduces the search space complexity and simulation time. According to the present invention, a single time-domain simulation is performed wherein the roles of the victim and attacker conductors are reversed. This technique requires only a single simulation (reducing computational load) configured such that the single victim functions as a single attacker and the N−1 attackers function as victims.

Reversing the roles of attackers and victims is valid under the assumption of regular and identical conductors (a symmetric transfer matrix). In particular, based upon an assumption of linearity and input/output symmetry, only a single simulation is executed, wherein a test signal $v_{test}$ is applied to the original victim conductor (now attacker) and a plurality of sampled output waveforms are generated on the original attacker conductors (now victims) $N_i[t]$. The total magnitude $$S[t] = \sum_{i=1}^{N-1} |N_i[t]|$$

is determined for all sampled time instants. Then, the maximum S[m] is determined such that:

S[m] ≥ S[t] for all t

The worst case switching vector is then obtained by determining the phase of each output signals at the sample point m.

The number of time steps necessary to capture possible combinations of the switching behavior of the attackers is far less than the $2^{N-1}$ total possible combinations because certain combinations of rising/falling on the attackers are excluded. This reduction in search space complexity is a direct result of the fact that signals in a digital system are designed to be highly non-oscillatory (either critically damped or over damped) and thus the signals tend to asymptotically approach zero.

Figure 2:
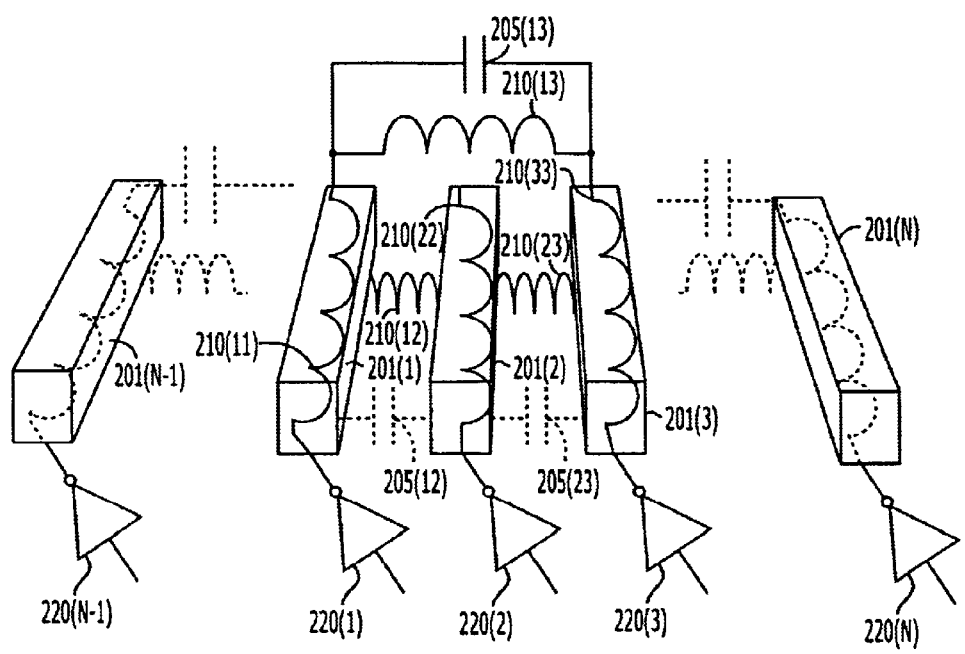
FIG. 2 depicts inductive and capacitive loading for a plurality of conductors.

FIG. 2 depicts inductive and capacitive loading for a plurality of conductors. Inductive noise may be generated due to loop inductance on a line or inductive coupling between lines. As shown in FIG. 2, each conductor 201(1)–201(N) may, for example, be a wire on a bus in a digital circuit network or, in general, any interconnect line. However, the present invention may be applied to any circuit network, analog or digital and thus lines 201(1)–201(N) represent any conductor in an analog or digital circuit network. As shown in FIG. 2, drivers 220(1)–220(N) are each coupled to a respective conductor 201(1)–201(N). Where conductors 201(1)–201(N) are bus lines, drivers 220(1)–220(N) may represent bus drive circuits. In general, drivers 220(1)–220(N) represent any circuit responsible for driving respective conductors 201(1)–201(N) to a specified voltage or current.

Note that each conductor 201(1)–201(N) is associated with a loop inductance 210(11), 210(22), 210(33)–210((N)(N)) representing the relationship between a voltage drop developed on the conductor with respect to a changing current on that conductor (effectively a measure of the loop's impedance to changes in current). Inductance is equal to the ratio of the magnetic flux through the surface of a current loop and the current in the loop as follows:

$$L = \iint_S \frac{B \cdot dS}{I}$$

Loop inductance relates to a parasitic effect that opposes a change in voltage as governed by the relationship:

$$V = L \frac{di}{dt}$$

Because the magnetic field stores energy, which cannot be dissipated instantaneously (i.e., the magnetic fields generated by the current will prevent the current from changing instantaneously). Typically, loop inductances 210(11)–210((N)(N)) are calculated as follows:

$$L_{loop} = L_{self1} + L_{self2} - L_{mutual1} - L_{mutual2}$$ where $L_{self1}$ and $L_{self2}$ are respectively the self-inductance of a first conductor and a second conductor and $L_{mutual1}$ and $L_{mutual2}$ are the mutual inductance of the first and second conductors respectively.

A second and usually more significant effect to consider in on-chip interconnects is inductive coupling. As shown in FIG. 2, an inductive coupling 210(11)–210(NN) is also associated between each pair of conductors 201(1)–201(N) in the network. Thus, for example, an effective inductive coupling between conductors 201(1)–201(2) is represented by inductive coupling 210(12). Similarly, an effective inductive coupling between conductors 201(1) and 201(3) is represented by inductive coupling 210(13). Inductive coupling occurs when the magnetic flux of a signal induces an electromotive force (emf) that drives an associated current in a "victim" signal.

$$Emf = -\frac{d\phi}{dt} \text{ where } \phi \text{ is the magnetic flux}$$

Further, a capacitive coupling 105(11)–105(NN) is associated with each pair of conductors 201(1)–201(N). Thus, for example, an effective capacitive coupling between conductors 201(1)–201(2) is represented by capacitive coupling 205(12). Similarly, an effective capacitive coupling by conductors 201(1) and 201(3) is represented by capacitive coupling 205(13).

Each conductor 201(1)–201(N) may function in a victim or attacker role with respect to capacitive and inductive effects in a circuit. Where it is desired to study the inductive and/or capacitive effects on a particular conductor 201(N), for example, conductor 201(N) would function as the victim and conductors 201(1)–201(N−1) would function as attackers.

Figure 3:
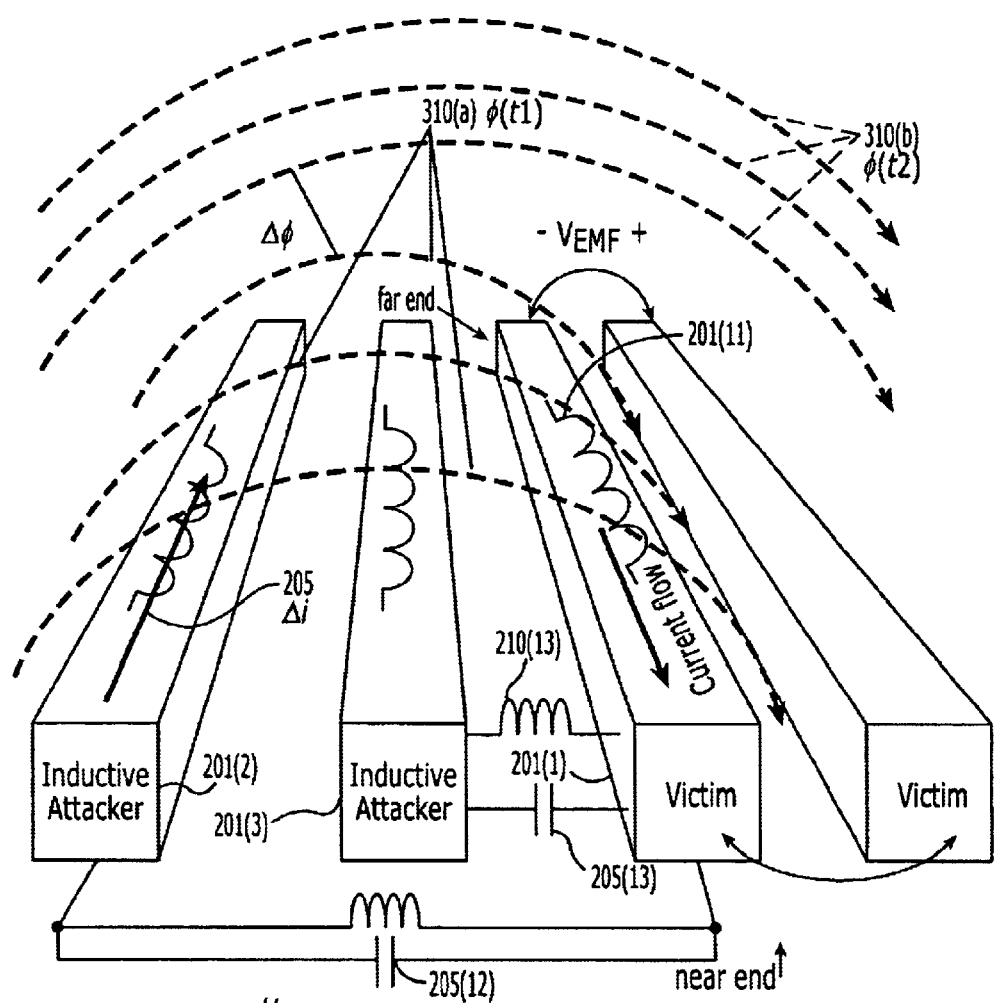
FIG. 3 illustrates a generation of inductive noise on a victim signal by an attacker signal.

FIG. 3 illustrates a generation of inductive noise on a victim signal by an attacker signal. As shown in FIG. 3, it is desired for this example to study the inductive noise generated on conductor 201(1) due to electromagnetic effects introduced by conductors 201(2) and 201(3). Thus, for this example conductor 201(1) functions as is a victim with respect to conductors 201(2)–201(3), which function as attackers. Note that conductor 201(1) is inductively and capacitively coupled to inductive attacker 201(2) via coupling capacitance 205(12) and coupling inductance 210(12) respectively. Similarly, conductor 201(1) is inductively and capacitively coupled to inductive attacker 201(3) via coupling capacitance 205(13) and coupling inductance 201(13) respectively. Inductor 201(1) is also associated with loop inductance 210(11).

Time varying magnetic field 310(a), 310(b) for respective times t1 and t2 generated by attacker signal 201(2) and/or attacker signal 201(3) impinge on the surface defined by the current loop in victim signal 201(3) (loop) generating a time varying magnetic flux φ(t1) and φ(t2) introducing flux differential Δφ. Typically, flux differential Δφ is caused by changing current Δi on either of attacker conductors 201(2) and 201(3) during a switching operation. For example, attacker conductors 201(2) and 201(3) may switch at the same time. For example, respect to coupling inductor 201(1), changing current Δi 305 on attacker 201(2) causes changing magnetic flux Δφ 315 introducing Emf on victim line according to the relationship (after taking the limit as t−>0)

$$Emf = -\frac{d\phi}{dt} \text{ where } \phi \text{ is the magnetic flux.}$$

Note that in addition to inductive noise described above, capacitive noise may be generated on victim conductor 201(1) due to capacitive coupling 205(12) and 205(13) associated with attacker inductors 201(2) and 202(3) respectively.

Figure 4:
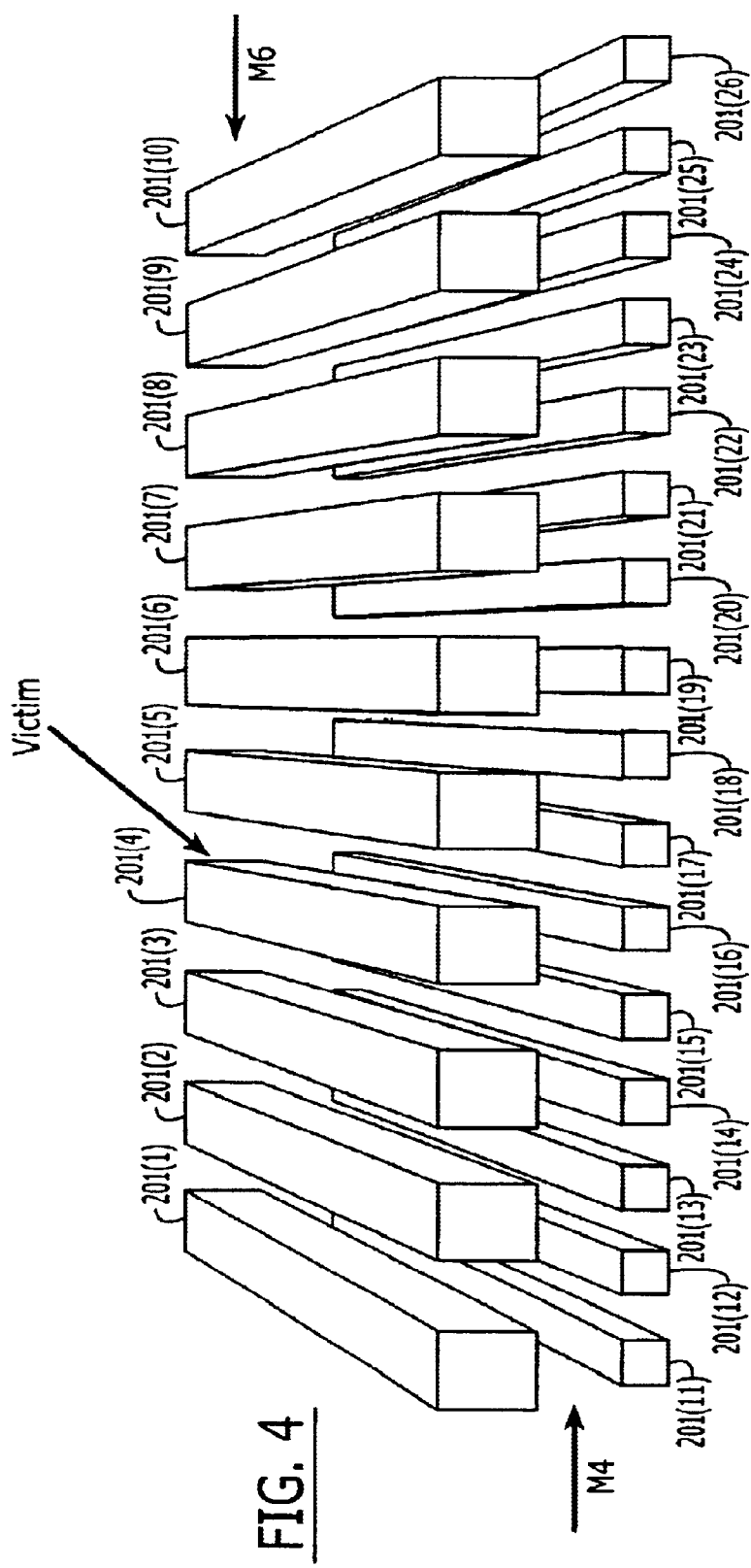
FIG. 4 depicts an exemplary scenario in which inductive noise is generated on a victim conductor by a plurality of attacker conductors.

FIG. 4 depicts an exemplary scenario in which inductive noise is generated on a victim conductor by a plurality of attacker conductors. According to the example shown in FIG. 4, it is desired to study inductive effects generated on conductor 201(4), which functions as a victim by a plurality of attacker conductors 201(1)–201(3) and 201(5)–201(26). Note that attacker conductors 201(1)–201(3) and 201(5)–201(1) are in metal 6 (M6) while conductor attackers 201(11)–201(26) are in metal 4 (M4).

Figure 5:
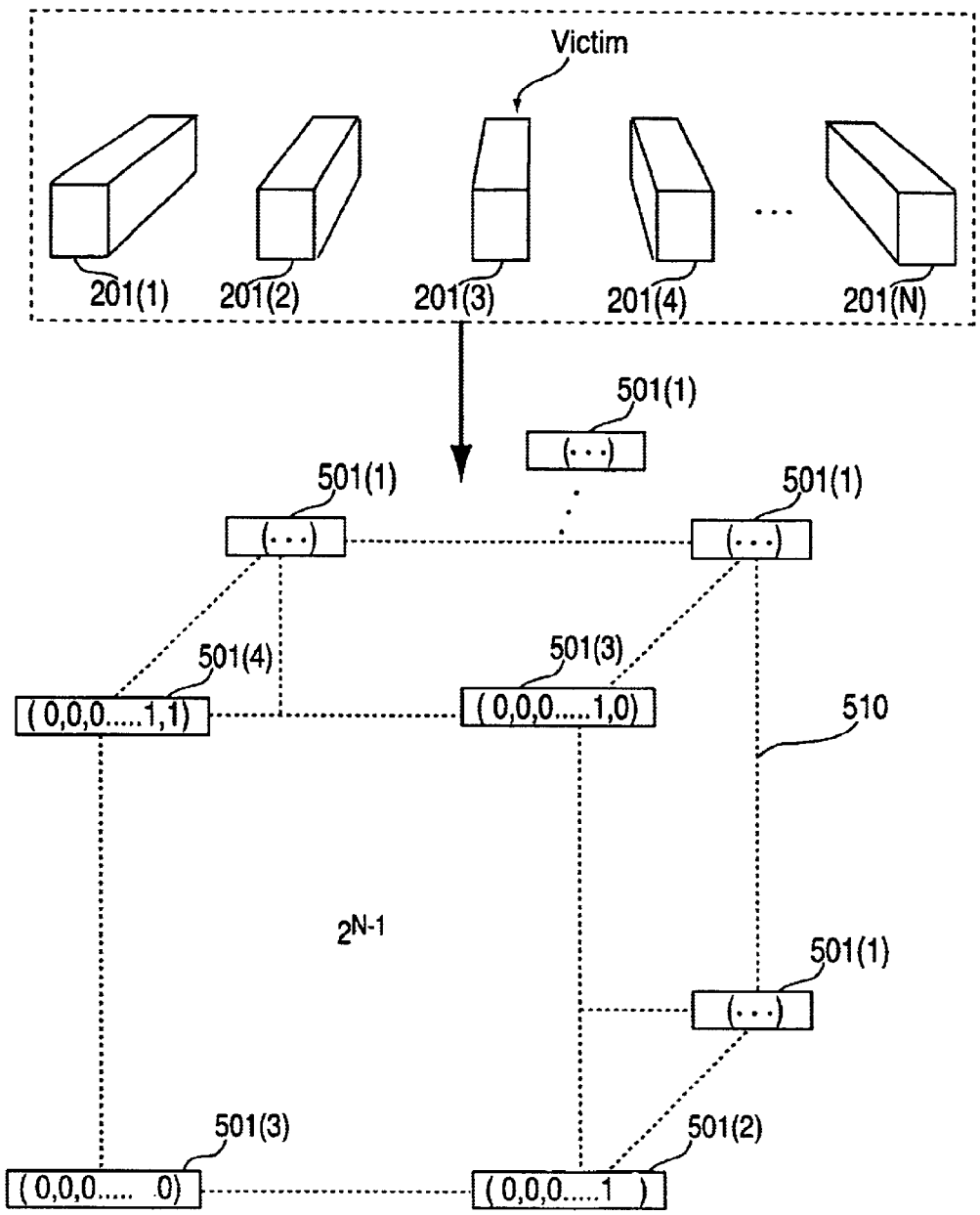
FIG. 5 depicts a search space for determining a worst case switching vector with respect to a victim conductor according to one embodiment of the present invention.

FIG. 5 depicts a search space for determining a worst case switching vector with respect to a victim conductor according to one embodiment of the present invention. As shown in FIG. 5, it is desired to study the inductive effects on a single conductor (e.g., 201(3)) of N conductors, which functions as a victim conductor for the purpose of this example. Thus, search space 510 includes $2^{N-1}$ possible switching vectors.

Utilizing conventional techniques for the determination of a worst case switching vector, simulation of the $2^{N-1}$ possible switching vectors would be computationally prohibitive. The present invention provides a method and system for greatly reducing the search space to determine a worst case switching vector for performing analysis of inductive effects on a victim conductor.

Figure 6:
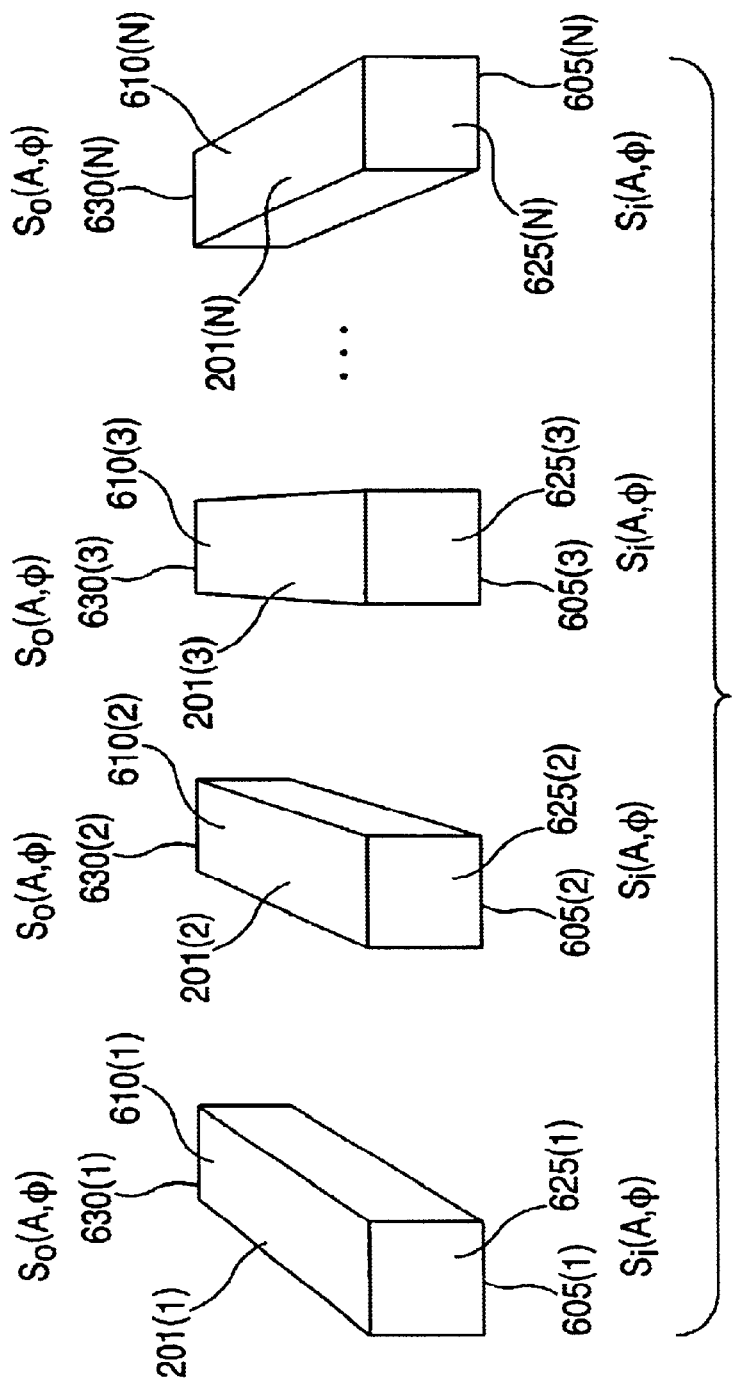
FIG. 6 depicts a plurality of conductors 201(1)–201(N) for which it is desired to determine a worst case switching vector according to one embodiment of the present invention.

FIG. 6 depicts a plurality of conductors 201(1)–201(N) for which it is desired to determine a worst case switching vector according to one embodiment of the present invention. Each conductor is associated with an input 605(1)–605(N) respectively and an output 610(1)–610(N) respectively. Input signals 625(1)–625(N) are introduced at the inputs of respective inputs 605(1)–605(N) as a result of a switching operation occurring on conductors 201(1)–201(N). Each input signal 625(1)–625(N) ($S_i(A, \phi)$) is associated with a respective magnitude A and phase φ. According to one embodiment, it is assumed that the magnitudes of input signals 625(1)–625(N) are identical as a result of the switching operation being tied to a common power rail, for example. Furthermore, according to one embodiment, all signals switch at the same time and therefore, it is assumed that phases φ of each input signal are either in phase or 180 degrees out of phase. This assumption is based on the fact that the input signals typically will be monotonic in nature and will have identical frequency content. Thus, the only difference between input signals 625(1)–625(N) will be their phase (i.e., whether they are switching up or down).

Output signals 630(1)–630(N) ($S_o(A,\phi)$) are generated at respective outputs 610(1)–610(N) as a result of the introduction of input signals 625(1)–625(N).

It is desired to determine a worst case switching vector with respect to a victim conductor. For the purposes of this example, the victim conductor is assumed to be 201(2) (i.e., it is desired to obtain the switching vector that produces the worst case output noise 630(2) on output 610(2)). In particular, it is desired to determine an input vector for the N−1 attacker conductors 201(1) and 201(3)–201(N) that produces the worst case noise at the output of the victim conductor 610(2). Treating the system as linear (and therefore the superposition principle holds) and performing analysis in the frequency domain, the output vector is linearly related to the input vector by the transfer function:

$$V_{out} = HV_{in}$$

where $V_{out}$ is an output vector with vector elements 630(1)–630(N). $V_{in}$ is an input vector (switching vector) with vector elements 625(1)–625(N):

H is a transfer matrix. The transfer function may be expressed as:

$$\begin{bmatrix} v_{out1} \\ v_{out2} \\ v_{out3} \\ \vdots \\ v_{outN} \end{bmatrix} = \begin{bmatrix} h_{11} & h_{12} & h_{13} & \ldots & h_{1N} \\ h_{21} & h_{22} & h_{23} & \ldots & h_{2N} \\ h_{31} & h_{32} & h_{33} & \ldots & h_{3N} \\ & & \ddots & & \\ h_{N1} & h_{N2} & h_{N3} & \ldots & h_{NN} \end{bmatrix} \begin{bmatrix} v_{in1} \\ v_{in2} \\ v_{in3} \\ \vdots \\ v_{inN} \end{bmatrix}$$

As noted earlier, the search space for determining a worst case switching vector includes $2^{N-1}$ possible switching vectors. According to the present invention, the number of simulations required and the scope of the search space is significantly reduced by observation of certain attributes of the system under consideration.

First, according to the present invention, it is assumed that the conductors under consideration are regular identical conductors. That is, the wire dimensions, inter-wire spacing and materials are assumed to be identical. These assumptions are supported by the fact that interconnects are passive, symmetric, linear systems since they are made up of R, L, and C components only. The assumption of regular and identical conductors yields a symmetric impedance matrix H. Because H is symmetric, an input signal 625(*i*) applied to conductor 201(*i*) producing output signal 630(*j*) on conductor 201(*j*) indicates that the same input signal 625(*i*) applied to conductor 201(*j*) will produce output signal 625(*j*) on conductor 201(*i*).

Combining the symmetric nature of matrix H and applying the superposition principle, according to the present invention, a worst case switching vector may be determined by studying the behavior of N−1 conductors to a single attacker, wherein the single attacker is the victim conductor for which the worst case switching vector is desired. Because of the symmetry inherent in the system (and thus the transfer matrix H), the magnitude of the noise signal produced on the victim conductor (e.g., 201(2)) by a particular attacker conductor 201(1) can be obtained also by switching the roles of attacker and victim conductors 201(1)–201(N). That is, an input signal may be applied to an input of the victim conductor (e.g., 625(1)) and the output signal generated at an output of a particular attacker conductor (e.g., 630(1)) will be identical to the output signal on the victim (e.g., 630(2)) had the input signal been applied to the input of the attacker conductor (e.g., 625(1)).

Furthermore, because the superposition principle is operative, the resultant noise signal at the output of a victim conductor (e.g., 630(2)) can be determined by summing the signals generated on the outputs of the N−1 attacker conductors (e.g., 630(1), 630(3)–630(N)) generated by applying an input signal to the input of the victim conductor (e.g., 625(2)).

Referring again to FIG. 6, in determining a worst case switching vector with respect to a particular victim conductor (i.e., 201(2)), $V_{out2}$ may be obtained as follows:

$$v_{out2} = h_{21} \cdot v_{in1} + h_{22} \cdot 0 + h_{23} \cdot v_{in3} + \ldots + h_{2N} \cdot v_{inN}$$

If an input signal $V_{in2}$ is applied to the input of the victim conductor (i.e., 201(2)), the following relations are obtained on attacker conductors 201(1), 201(3)–201(N):

$$v'_{out1} = h_{11} \cdot 0 + h_{12} \cdot v_{in2} + h_{13} \cdot 0 + \ldots + h_{1N} \cdot 0$$
$$v'_{out3} = h_{31} \cdot 0 + h_{32} \cdot v_{in2} + h_{33} \cdot 0 + \ldots + h_{3N} \cdot 0$$
$$\vdots$$
$$v'_{outN} = h_{N1} \cdot 0 + h_{N2} \cdot v_{in2} + h_{N3} \cdot 0 + \ldots + h_{NN} \cdot 0$$

Because it is assumed that the switching behavior all occurs from a common power rail, $|v_{in1}| = |v_{in2}| = \ldots |v_{inN}|$. Furthermore:

$$|v_{out2}| = |v'_{out1}| + \sum_{i=3}^{N} |v'_{outi}| \text{ because } h_{ij} =$$

$$h_{ji} \text{ and } |v_{in1}| = |v_{in2}| = \ldots |v_{inN}|.$$

Therefore, only the phases of $v_{in1}$, $v_{in3}$–$v_{inN}$ need to be determined and these phases will be either 0 or 180 degrees due to the fact that it is assumed all signals switch simultaneously.

According to the present invention, the observations noted above are utilized to determine a worst case switching vector. In particular, a single simulation is run in which the roles of the attacker conductors and victim conductors are reversed so that the resulting output waveforms produced by a single attacker (originally the victim conductor) are determined. These output waveforms are summed to generate a total noise waveform and a sample point of maximum noise is determined. The phases of the attacker conductors can then be determined by noting the phase of the output waveforms on the victim conductors produced by the single attacker at the sample point of maximum noise.

Utilizing the method of the present invention, the computational complexity is greatly reduced. In particular, only a single simulation is necessary and the search space is reduced greatly. Because the system is linear and the transfer matrix H is symmetric, a single simulation may be executed by reversing the roles of the N−1 attackers to function as victims and the single victim to function as an attacker. The search space is reduced as the number of time steps necessary to capture possible combinations of the switching behavior of the attackers is far less than the $2^{N-1}$ total possible combinations because certain combinations of rising/falling on the attackers are excluded. This reduction in search space complexity is a direct result of the fact that signals in a digital system are designed to be highly non-oscillatory (either critically damped or over damped) and thus the signals tend to asymptotically approach zero.

Figure 7:
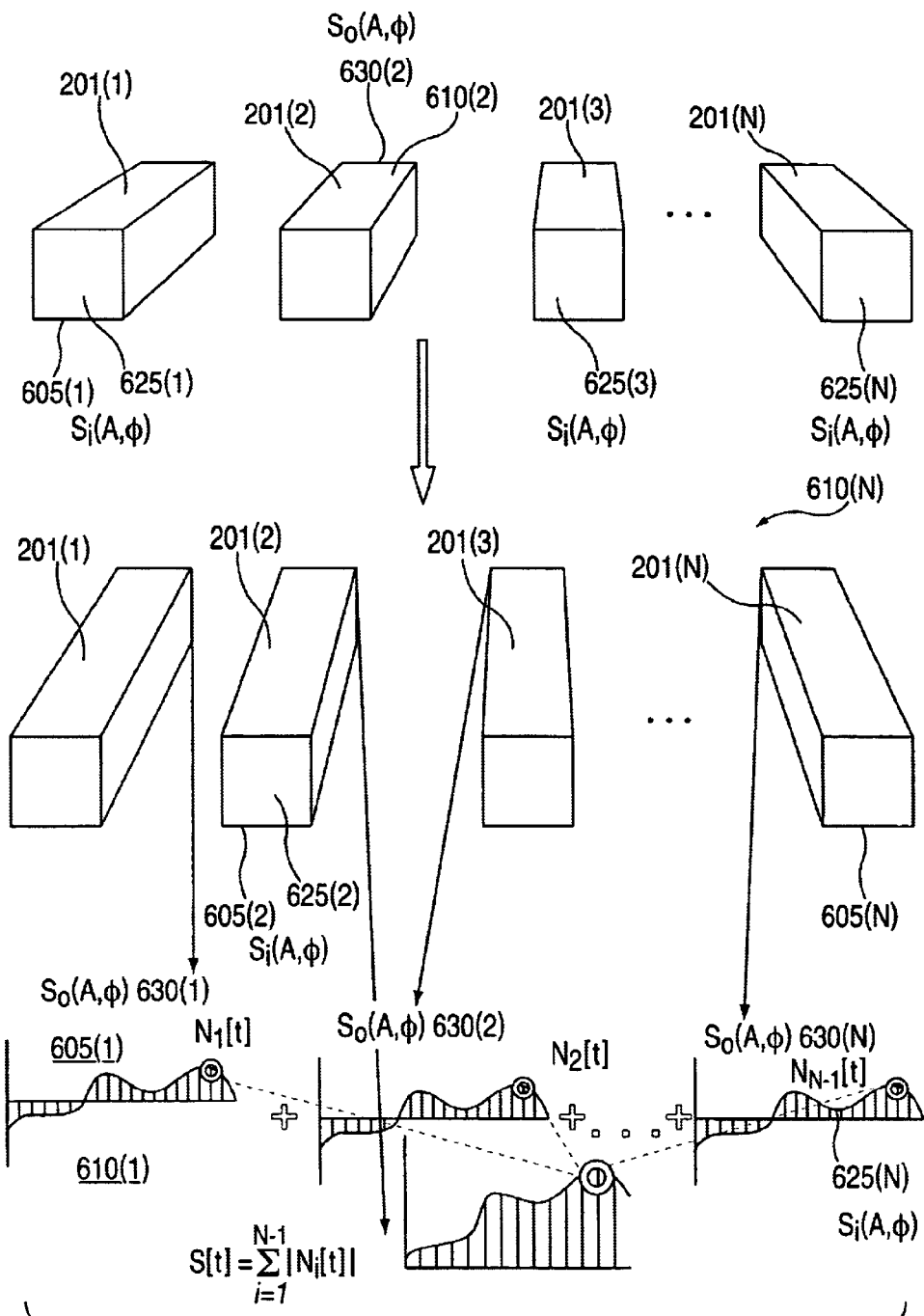
FIG. 7 illustrates a method for determining a worst case switching vector according to one embodiment of the present invention.

FIG. 7 illustrates a method for determining a worst case switching vector utilizing the observations of a linear system and symmetric transfer matrix according to one embodiment of the present invention. It is desired to determine a worst case switching vector with respect to a victim conductor, which according to this example is conductor 201(2). Thus, the magnitude A and phase φ of input signals 625(1) and 625(3)–625(N), which collectively generate worst case noise 630(2) on conductor 201(2) must be determined. Note, however, that although FIG. 7 shows an exemplary configuration for determining worst case noise on conductor 201(2), the present invention may be applied to determine a worst case switching vector for any conductor 201(1)–201(N).

In step 710, the role of attacker conductors and victim conductors are reversed. Thus, for purposes of this example, attacker conductors 201(1) and 201(3)–201(N) are now treated as victims and victim attacker 201(2) functions as a single attacker. A time-domain simulation is run in which test signal 602(2) is applied to the input of he victim conductor 201(2) and the outputs are 630(1), 630(3)–630(N) ($N_1[t]$–$N_{N-1}[t]$) are determined at the outputs of conductors 201(1) and 201(3)–201(N) respectively. In particular, output signals $N_1[t]$–$N_{N-1}[t]$ are sampled utilizing an appropriate sample rate.

According to the present invention, a single simulation is performed in the time-domain wherein the roles of the victim and attacker conductors are switched. A simulation is executed in which a test signal $v_{test}$ is applied to the original victim conductor (now attacker) and a plurality of sampled output waveforms are generated on the original attacker conductors (now victims) $N_i[t]$. The total magnitude $$S[t] = \sum_{i=1}^{N-1} |N_i[t]|$$

is determined for all sampled time instants. Then, the maximum S is determined such that
$S[m] \geq S[t]$ for all t
The worst case switching vector is then obtained by determining the phases of output signals 630(1) and 630(3)–630(N) at the sample point m.

Figure 8:
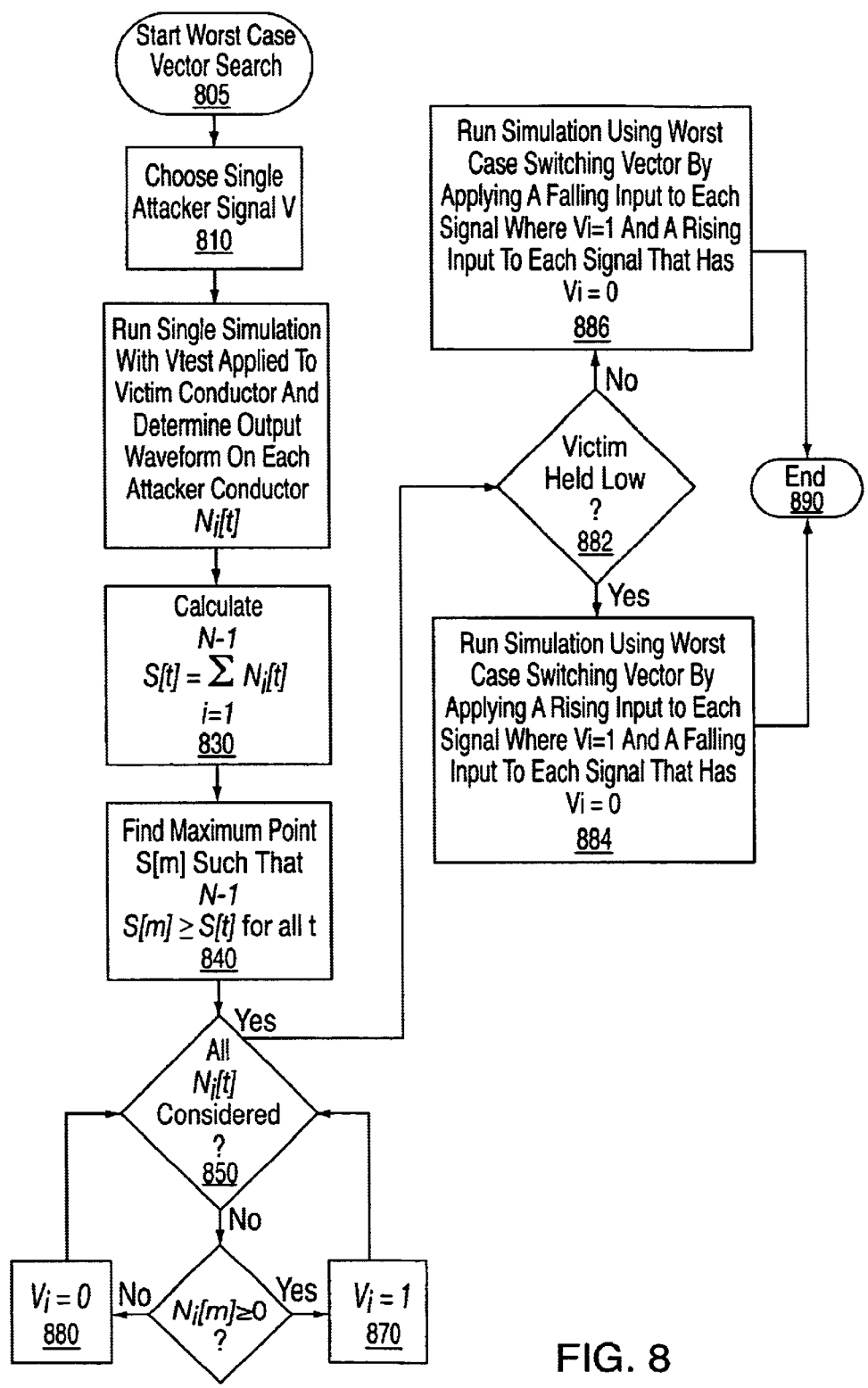
FIG. 8 is a flowchart depicting a method for computing a worst case switching vector according to one embodiment of the present invention.

FIG. 8 is a flowchart depicting a method for computing a worst case switching vector according to one embodiment of the present invention. The process is initiated in step 805. In step 810, a test signal $v_{test}$ is determined. In step 820, a single time domain simulation is run by applying $v_{test}$ to the victim conductor and determining the sampled output waveform on each attacker conductor $N_1[t]$–$N_{N-1}[t]$. In step 830, $N_i[t]$. The total magnitude $$S[t] = \sum_{i=1}^{N-1} |N_i[t]|$$

is determined for all sampled time instants. In step 840, a maximum $S[m]$ is determine such that:
$S[m] \geq S[t]$ for all t
In step 850, it is determined whether all output waveforms $N_i[t]$ have been considered. If not ('no' branch of step 850), in step 860 it is determined whether $N_i[m] \geq 0$. If so ('yes' branch of step 860), $V_i$ in the switching vector is set as 1 in step 870. Otherwise ('no' branch of step 860), $V_i$ in the switching vector is set as 0 in step 880.

If all output waveforms $N_i[t]$ have been considered ('yes' branch of step 850), flow continues with step 882 and it is determined whether the victim conductor was held low during the simulation. If so ('yes' branch of step 882), a simulation is conducted using worst case switching vector by applying a rising input to each signal where Vi=1 and a falling input to each signal that has Vi=0. Otherwise ('no' branch of step 882), a simulation is run using worst case switching vector by applying a falling input to each signal where Vi=1 and a rising input to each signal that has Vi=0.

According to an alternate embodiment, the technique of the present invention may be applied to systems that do not have a symmetric transfer matrix. In particular, the present invention is applicable if the system is not highly oscillatory and the signals are switched with similar rise and fall times.

According to an alternate embodiment, the technique of the present invention is applied utilizing a windowing function. Utilizing the windowing function, $S[t]$ is calculated as follows:

$$S[t] = \sum_{i=1}^{N-1} \sum_{T=t-W}^{t+W} f(|T-t|)|N_i[T]|$$

where f( ) is some weighting function distribution and W is the window length. Note that if the weighting function is such that it f(0)=1 and f(x)=0 if x is not 0, then the S[t] calculation simplifies to the previous equation for S[t].

Utilizing the windowing function for S[t] as shown above, $S[m]$ is calculated as described above. That is, an m is found such that $S[m]$ is greater than or equal to $S[t]$ for all t. Vi may then be computed by determining whether $$\sum_{T=m-W}^{m+W} f(|T-m|)N_i[T] > 0.$$

If the inequality is not true Vi is set to the first value; otherwise Vi is set to the second value.

According to one alternative embodiment, the method of the present invention may be applied for determining arbitrary phases of the input signals (i.e., assuming they do not switch simultaneously). According to this embodiment, the victim signals are shifted in time to be aligned such that their maximum values are aligned. The phases are then determined by extracting the phase shift necessary for each signal to align their peak values. This method may be combined with the windowing method described above to further improve accuracy.

A method and system for determination of a worst case switching vector with respect to inductive noise, which greatly reduces the search space complexity and simulation time has been described. According to the present invention, a single time-domain simulation is performed wherein the roles of the victim and attacker conductors are reversed. This technique requires only a single simulation (reducing computational load) configured such that the single victim functions as a single attacker and the N−1 attackers function as victims.

What is claimed is:

1. A method for determining a worst case switching vector in a circuit network, wherein the circuit network is represented as including a victim node and a plurality of attacker nodes, comprising:
   (a) setting the victim node to function as an attacker node and the attacker nodes to function as victim nodes;
   (b) applying a test signal to the victim node;
   (c) determining a response signal $N_i[t]$ for each attacker node generated by the application of the test signal to the victim node;
   (d) determining a time instant associated with a maximum noise; and,
   (e) determining a phase for each response signal at the time instant of maximum noise.

2. The method according to claim 1, further comprising determining a total response signal S(t) by summing each of the response signals $N_i[t]$ associated with the victim nodes N for each time sample t, according to the relationship:

$$S[t] = \sum_{i=1}^{N-1} |N_i[t]|.$$

3. The method according to claim 2, further comprising determining a maximum response time sample m with respect to the total response signal, wherein $S[m] \geq S[t]$ for all t, wherein $S[m]$ is the response signal at time sample m.

4. The method according to claim 3, further comprising generating a worst case switching vector V[i] for each response signal $N_i[t]$, wherein:

if
   $N_i[m] \geq 0$ setting V[i] to a first value;
   if $N_i[m] < 0$ setting V[i] to a second value.

5. The method according to claim 3, further comprising:
   (a) if the victim node is held low, using the worst case switching vector V[i] in a noise simulation by applying a rising input to each node for which V[i] equals a first value and applying a falling input to each node for which V[i] equals a second value;
   (b) if the victim node is held high, using the worst case switching vector in a noise simulation by applying a falling input to each node for which V[i] equals the first value and applying a rising input to each node for which V[i] equals the second value.

6. The method according to claim 1, wherein the conductors in the network are substantially identical in composition.

7. The method according to claim 1, wherein the conductors in the network comprise a linear network.

8. The method according to claim 1, further comprising determining a total response signal S[t] by summing each of the response signals Ni[t] associated with the victim nodes N for each time sample t, according to the relationship:

$$S[t] = \sum_{i=1}^{N-1} \sum_{T=t-W}^{t+W} f(|T-t|)|N_i[T]|$$

wherein W is the window length and T is the time period of total response signal.

9. The method according to claim 8, further comprising generating a worst case switching vector V for each response signal $N_i[t]$ by:

if $\sum_{T=m-W}^{m+W} f(|T-m|)N_i[T] > 0$ setting $V[i]$ to a first value;

if $\sum_{T=m-W}^{m+W} f(|T-m|)N_i[T] > 0$ setting $V[i]$ to a second value, wherein m is the maximum response time sample.

10. A system for determining a worst case switching vector in a circuit network, wherein the circuit network is represented as including a victim node and a plurality of attacker nodes, comprising:
   a central processing unit ("CPU"), wherein the CPU is adapted to:
   set the victim node to function as an attacker node and the attacker nodes to function as victim nodes;
   apply a test signal to the victim node;
   determine a response signal $N_i[t]$ for each attacker node generated by the application of the test signal to the victim node;
   determine a time instant associated with a maximum noise; and,
   determine a phase for each response signal at the time instant of maximum noise.

11. The system according to claim 10, wherein the CPU determines a total response signal S[t] by summing each of the response signals $N_i[t]$ associated with the victim nodes N for each time sample t, according to the relationship:

$$S[t] = \sum_{i=1}^{N-1} |N_i[t]|.$$

12. The system according to claim 11, wherein the CPU determines a maximum response time sample m with respect to the total response signal, wherein $S[m] \geq S[t]$ for all t, wherein $S[m]$ is the response signal at time sample m.

13. The system according to claim 12, wherein the CPU determines a worst case switching vector V(i) by for each response signal $N_i[t]$, wherein:

if
   $N_i[m] \geq 0$ setting V[i] to a first value;
   if $N_i[m] < 0$ setting V[i] to a second value.

14. The system according to claim 10, wherein the conductors in the network comprise a linear network.

15. The system according to claim 10, wherein the conductors in the network comprise a linear network.

16. The system according to claim 10, wherein the CPU:
   (a) if the victim node is held low, utilizes the worst case switching vector V[i] in a noise simulation by applying a rising input to each node for which V[i] equals a first value and applying a falling input to each node for which V[i] equals a second value,
   (b) if the victim node is held high, utilizes the worst case switching vector V[i] in a noise simulation by applying a falling input to each node for which V[i] equals the first value and applying a rising input to each node for which V[i] equals the second value.

17. A program storage device storing instructions executable by a CPU including instructions for determining a worst case switching vector in a circuit network, wherein the circuit network is represented as including a victim node and a plurality of attacker nodes, comprising instructions for:
   setting the victim node to function as an attacker node and the attacker nodes to function as victim nodes;
   applying a test signal to the victim node;
   determining a response signal $N_i[t]$ for each attacker node generated by the application of the test signal to the victim node;
   determining a time instant associated with a maximum noise; and,
   determining a phase for each response signal at the time instant of maximum noise.

18. The program storage device according to claim 17, wherein the program storage device includes instructions for determining a total response signal S[t] by summing each of the response signals $N_i[t]$ associated with the victim nodes N for each time sample t, according to the relationship:

$$S[t] = \sum_{i=1}^{N-1} |N_i[t]|.$$

* * * * *

UNITED STATES PATENT AND TRADEMARK OFFICE
CERTIFICATE OF CORRECTION

PATENT NO. : 6,675,365 B2
DATED : January 6, 2004
INVENTOR(S) : Mark Elzinga

It is certified that error appears in the above-identified patent and that said Letters Patent is hereby corrected as shown below:

Column 11,
Lines 41 and 44, ">0 setting V[i]" should be -- >0, setting V[i] --.
Line 46, "wherein m is the maximumresponse time sample." should be
-- wherein m is the maximum response time sample. --.

Column 12,
Line 22, "in the network comprise a linear network." should be -- in the network are substantially identical in composition. --.

Signed and Sealed this

Twenty-second Day of November, 2005

JON W. DUDAS
*Director of the United States Patent and Trademark Office*